(12) United States Patent
Seacrist et al.

(10) Patent No.: US 11,942,360 B2
(45) Date of Patent: Mar. 26, 2024

(54) RADIO FREQUENCY SILICON ON INSULATOR STRUCTURE WITH SUPERIOR PERFORMANCE, STABILITY, AND MANUFACTURABILITY

(71) Applicant: GlobalWafers Co., Ltd., Hsinchu (TW)

(72) Inventors: Michael R. Seacrist, Lake St. Louis, MO (US); Robert W. Standley, Chesterfield, MO (US); Jeffrey L. Libbert, O'Fallon, MO (US); Hariprasad Sreedharamurthy, Ballwin, MO (US); Leif Jensen, Frederikssund (DK)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 18/182,823

(22) Filed: Mar. 13, 2023

(65) Prior Publication Data

US 2023/0215759 A1  Jul. 6, 2023

Related U.S. Application Data

(63) Continuation of application No. 17/234,023, filed on Apr. 19, 2021, now Pat. No. 11,626,318, which is a
(Continued)

(51) Int. Cl.
*H01L 21/762* (2006.01)
*C30B 15/20* (2006.01)
(Continued)

(52) U.S. Cl.
CPC ...... *H01L 21/76243* (2013.01); *C30B 15/206* (2013.01); *C30B 29/06* (2013.01);
(Continued)

(58) Field of Classification Search
None
See application file for complete search history.

(56) References Cited

U.S. PATENT DOCUMENTS 6,350,703 B1  2/2002  Sakaguchi et al.
6,448,152 B1  9/2002  Henley et al.
(Continued)

FOREIGN PATENT DOCUMENTS

CN  1606799 A  4/2005
CN  101044611 A  9/2007
(Continued)

OTHER PUBLICATIONS

Eggert, Dietmar et al., "A SOI-FR-CMOS Technology on High Resistiity SIMOX Substrates for Microwave Application to 5 Ghz", IEEE Transaction on Electron Devices, Nov. 1997, pp. 1981-1989, vol. 44, No. 11.
(Continued)

*Primary Examiner* — Hsien Ming Lee
(74) *Attorney, Agent, or Firm* — Armstrong Teasdale LLP

(57) ABSTRACT

A semiconductor-on-insulator (e.g., silicon-on-insulator) structure having superior radio frequency device performance, and a method of preparing such a structure, is provided by utilizing a single crystal silicon handle wafer sliced from a float zone grown single crystal silicon ingot.

31 Claims, 7 Drawing Sheets

Related U.S. Application Data continuation of application No. 16/508,606, filed on Jul. 11, 2019, now Pat. No. 11,075,109.

(60) Provisional application No. 62/697,474, filed on Jul. 13, 2018.

(51) Int. Cl.
    *C30B 29/06*     (2006.01)
    *H01L 21/322*     (2006.01)
    *H01L 23/66*     (2006.01)
    *H01L 27/12*     (2006.01)
    *H01L 29/06*     (2006.01)

(52) U.S. Cl.
    CPC .... *H01L 21/3226* (2013.01); *H01L 21/76251* (2013.01); *H01L 23/66* (2013.01); *H01L 27/1203* (2013.01); *H01L 29/0649* (2013.01); *H01L 2223/6661* (2013.01)

(56) References Cited

U.S. PATENT DOCUMENTS

| | | | |
|---|---|---|---|
| 6,544,656 B1 | 4/2003 | Abe et al. | |
| 6,653,209 B1 | 11/2003 | Yamagata | |
| 7,084,459 B2 | 8/2006 | Sasaki et al. | |
| 7,135,351 B2 | 11/2006 | Binns et al. | |
| 7,153,757 B2 | 12/2006 | McCann et al. | |
| 7,417,297 B2 | 8/2008 | Murphy et al. | |
| 7,521,382 B2 | 4/2009 | Falster et al. | |
| 8,313,989 B2 | 11/2012 | Ohnuma et al. | |
| 8,323,403 B2 | 12/2012 | Graef et al. | |
| 8,765,571 B2 | 7/2014 | Kononchuk et al. | |
| 9,853,133 B2 | 12/2017 | Thomas et al. | |
| 9,984,949 B1 | 5/2018 | De Souza et al. | |
| 10,332,782 B2 | 6/2019 | Wang et al. | |
| 10,468,295 B2 * | 11/2019 | Libbert | H01L 21/0262 |
| 11,145,538 B2 * | 10/2021 | Libbert | H01L 23/18 |
| 2002/0157598 A1 | 10/2002 | Hoshi et al. | |
| 2003/0054641 A1 | 3/2003 | Binns et al. | |
| 2004/0003769 A1 | 1/2004 | Tamatsuka et al. | |
| 2007/0269361 A1 | 11/2007 | Kulkarni | |
| 2008/0254595 A1 | 10/2008 | Kawai et al. | |
| 2009/0081856 A1 | 3/2009 | Umeno | |
| 2010/0193900 A1 | 8/2010 | Ohmi et al. | |
| 2010/0224968 A1 | 9/2010 | Kurita | |
| 2011/0024810 A1 | 2/2011 | Janesick | |
| 2015/0115480 A1 | 4/2015 | Peidous et al. | |
| 2017/0243781 A1 | 8/2017 | Peidous et al. | |
| 2017/0316968 A1 | 11/2017 | Peidous et al. | |
| 2017/0338143 A1 | 11/2017 | Peidous et al. | |
| 2018/0114720 A1 | 4/2018 | Wang et al. | |
| 2018/0138080 A1 | 5/2018 | Usenko | |
| 2018/0158721 A1 | 6/2018 | Libbert et al. | |
| 2018/0174892 A1 | 6/2018 | Peidous et al. | |
| 2019/0386640 A1 | 12/2019 | Akiyma et al. | |
| 2020/0020766 A1 | 1/2020 | Seacrist et al. | |

FOREIGN PATENT DOCUMENTS

| | | |
|---|---|---|
| CN | 101728312 A | 6/2010 |
| EP | 2607526 A1 | 6/2013 |
| EP | 3623801 A1 | 3/2020 |
| KR | 20070077073 A | 7/2007 |
| TW | 201239990 A1 | 10/2012 |
| TW | 201614714 A | 4/2016 |
| TW | 201709333 A | 3/2017 |
| WO | 2003060982 A2 | 7/2003 |
| WO | 2006053331 A1 | 5/2006 |
| WO | 2017214084 A1 | 12/2017 |

OTHER PUBLICATIONS

International Search Report and Written Opinion issued in Application No. PCT/US2019/039714, dated Sep. 10, 2019 (13 pages).
International Search Report and Written Opinion issued in Application No. PCT/US2019/041345, dated Sep. 10, 2019 (13 pages).

* cited by examiner

RADIO FREQUENCY SILICON ON INSULATOR STRUCTURE WITH SUPERIOR PERFORMANCE, STABILITY, AND MANUFACTURABILITY

CROSS REFERENCE TO RELATED APPLICATION(S)

This application is a continuation application of and claims priority to U.S. patent application Ser. No. 17/234,023, which was filed Apr. 19, 2021, which is a continuation application of and claims priority to U.S. patent application Ser. No. 16/508,606, which was filed Jul. 11, 2019, now U.S. Pat. No. 11,075,109, issued Jul. 27, 2021, which claims priority to U.S. Provisional Patent Application No. 62/697,474, which was filed Jul. 13, 2018, the disclosures of which are hereby incorporated herein by reference as if set forth in their entirety.

THE FIELD OF THE INVENTION

The present invention generally relates to the field of semiconductor wafer manufacture. More specifically, the present invention relates to a method of preparing a semiconductor-on-insulator (e.g., silicon-on-insulator) structure and a semiconductor-on-insulator structure having superior radio frequency device performance.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, hydrogen bonding, or both, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as bond and etch SOI (i.e., BESOI) or bond and grind SOI (i.e., BGSOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds and any other particulate matter, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. Lower bonding temperatures reduce the bridging layers of adsorbed water vapor on the surfaces, and increase the density of hydrogen bonds between silanol groups on the surfaces of each wafer. In some processes, wafer bonding may occur at high temperatures, such as between approximately 800° C. and 1100° C. Higher elevated temperatures cause the formation of covalent bonds, e.g., converting silanol hydrogen bonds to covalent siloxane bonds, between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical force at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprises a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to suppress the formation of any induced inversion or accumulation layers so that the high resistivity of the substrate is maintained even in the very near surface region. It is known that trap rich layers between the high resistivity handle substrates and the buried oxide (BOX) may improve the performance of RF devices fabricated using SOI wafers. A number of methods have been suggested to form these high interface trap layers. For example, with reference now to FIG. 2, one of the method of creating a semiconductor-on-insulator multilayer structure 20 (e.g., a silicon-on-insulator, or SOI) with a trap rich layer for RF device applications is based on depositing an undoped polycrystalline silicon film 28 on a silicon substrate having high resistivity 22 and then forming a stack of oxide (e.g., buried oxide layer 24) and top silicon layer 26 on it. A polycrystalline silicon layer 28 acts as a high defectivity layer between the silicon substrate 22 and the buried oxide layer 24. See FIG. 2, which depicts a polycrystalline silicon film for use as a trap rich layer 28 between a high resistivity substrate 22 and the buried oxide layer 24 in a silicon-on-insulator multilayer structure 20. An alternative method is the implantation of heavy ions to create a near surface damage layer. Devices, such as radiofrequency devices, are built in the top silicon layer 26.

It has been shown in academic studies that the polycrystalline silicon layer between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J. P. Raskin, "Enhanced high resistivity SOI wafers for RF applications," *IEEE Intl. SOI Conf*, pp. 46-47, 2004; D. Lederer and J. P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J. P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

Briefly, the present invention is directed to a multilayer structure comprising: a single crystal silicon wafer handle substrate comprising two major, generally parallel surfaces, one of which is a front surface of the single crystal silicon wafer handle substrate and the other of which is a back surface of the single crystal silicon wafer handle substrate, a circumferential edge joining the front and back surfaces of the single crystal silicon wafer handle substrate, and a central plane of the single crystal silicon wafer handle substrate between the front and back surfaces of the single crystal silicon wafer handle substrate, wherein the single crystal silicon wafer handle substrate has a bulk resistivity of at least about 5000 ohm-cm, an interstitial oxygen concentration of less than about $1 \times 10^{16}$ atoms/cm$^3$, and a nitrogen concentration of at least about $1 \times 10^{13}$ atoms/cm$^3$; a trap rich layer in interfacial contact with the front surface of the single crystal silicon wafer handle substrate; a dielectric layer in interfacial contact with the trap rich layer; and a single crystal semiconductor device layer in interfacial contact with the dielectric layer.

DETAILED DESCRIPTION OF THE EMBODIMENT(S) OF THE INVENTION

Figure 1:
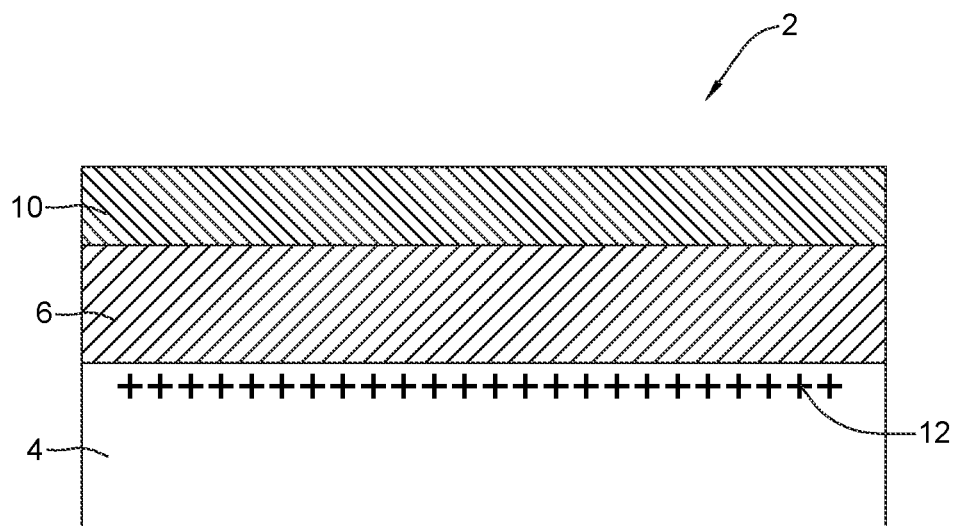
FIG. 1 is a depiction of a silicon-on-insulator wafer comprising a high resistivity substrate and a buried oxide layer.

According to the present invention, a method is provided and a structure is provided for producing semiconductor-on-insulator (e.g., silicon-on-insulator) structures that enables superior radio frequency (RF) device performance, device stability, and device fabrication manufacturability. The present invention integrates a high resistivity, e.g. a very-high resistivity or a ultra-high resistivity, float zone (FZ) silicon base wafer (handle wafer) and a trap rich layer into a semiconductor-on-insulator (e.g., silicon-on-insulator) structure.

Radio frequency (RF) chip designs significantly benefit from higher substrate resistivity levels. Improvements in the quality factor of passive components, such as inductors and capacitors, reduced attenuation in transmission lines, and substrate electrical isolation between the integrated digital, RF, and analog components are realized with higher resistivity silicon substrates. The industry standard is handle substrate resistivity above 1,000 ohm-cm, with yet higher resistivity preferred. Integration of the high resistivity substrate into semiconductor-on-insulator (e.g., silicon-on-insulator) structure (HRSOI) further improves RF capability by providing better device isolation, reduced conductive coupling to the substrate wafer, and lower junction capacitance.

Growth of ultra-high resistivity Czochralski (CZ) crystals to resistivity values greater than 7,500 ohm-cm presents severe challenges. Since the concentration of added electrically active dopant is significantly reduced, additional emphasis must be placed on the control of dopants, such as boron and phosphorous, introduced from all the raw materials and components used in the CZ crystal puller. These materials and components include the polysilicon source materials and the quartz crucible. In addition, the extremely low dopant level in the melt makes control of dopant mass transfer to, and then through, the boundary layer at the melt-solid interface important for achieving acceptable radial resistivity variation. Another key challenge in the growth of higher resistivity Czochralski silicon ingot is to control the behavior of the interstitial oxygen incorporated during crystal growth. The interstitial oxygen concentration in Czochralski-grown silicon is usually greater than $5 \times 10^{17}$ atoms/cm$^3$ (10 PPMA new-ASTM), such as up to about $1 \times 10^{18}$ atoms/cm$^3$ (20 PPMA new-ASTM). A source of such interstitial oxygen is the dissolution of the SiO$_2$ crucible during crystal growth. In high resistivity CZ silicon, oxygen can be controlled to about 5 PPMA ($2.5 \times 10^{17}$ atoms/cm$^3$) range, and lower, such as about 2 PPMA ($1 \times 10^{17}$ atoms/cm$^3$), about 3 PPMA ($1.5 \times 10^{17}$ atoms/cm$^3$), and about 4 PPMA ($2 \times 10^{17}$ atoms/cm$^3$). Even at low concentrations, interstitial oxygen, however, may agglomerate into electrically active thermal donors depending strongly on both interstitial oxygen concentration and annealing time/temperature in the range of 350-500° C. At agglomeration levels greater than 4 oxygen atoms, the thermal donors become electrically active, acting as double donors. The formation of such donors maximizes at about 450° C. and thereafter declines, and they may dissociate at anneal treatments above about 550° C., and return to an electrically inactive state. However, at longer anneal times and higher anneal temperatures, such as in the range of 550° C. to 850° C., so-called new thermal donors may form. Peak new thermal donor formation occurs at temperatures from 750° C. to 800° C. We have recently discovered another class of excess donors in high resistivity silicon subjected to high temperature heat treatments. An as-yet unidentified, fast diffusing species is introduced into the silicon wafer during very high T anneals and quenched in during wafer cooling. On subsequent heating into the 450° C.-650° C. range, these species rapidly complex with the interstitial oxygen in the wafer to form electrically active "excess donors". These excess donors will dissociate if heated above about 1050° C.-1100° C. The oxygen thermal double donors, new donors, and excess thermal donors contribute electrons to conduction which can, depending on the number of donors generated versus the background carrier concentration of the wafer, alter the resistivity and type of the wafer. In p-type silicon, thermal donors increase the resistivity of the wafer until the thermal donor concentration exceeds the p-type carrier concentration, at which point the wafer will convert to n-type. Further thermal donor generation will then cause the n-type wafer to have lower and lower resistivity. Changes in resistivity during or at the end of the device fabrication process can disrupt resistivity sensitive manufacturing processes and cause device performance degradation. Thermal donors can in principle be annihilated by high T anneal (greater than about 550° C. for thermal double donors, between about 1050° C. and about 1100° C. for new donors and excess donors), in practice most of these donor are formed by the low temperature annealing steps (that may occur at a temperature of about 450° C.) that occur late in the integrated circuit manufacturing flow (in the back end of line, BEOL), after metallization. Once the metal is deposited, the wafers cannot be heated to T above about 500° C., so none of the thermal donor species formed in BEOL can be annihilated. While thermal donors formed in the range of 350-500° C. may be eliminated with a short duration, high temperature anneal, the presence of excess thermal donors becomes particularly notable for high resistivity silicon having resistivity greater than 4000 ohm-cm and significant for material having resistivity greater than 7500 ohm-cm. In such materials, dopant concentration may be $1.8 \times 10^{12}$/cm$^3$ (p-type) or $N_d < 5 \times 10^{11}$/cm$^3$ (n-type). For comparison, excess thermal donor concentrations may be in about $1 \times 10^{12}$/cm$^3$ excess donors for materials annealed at temperatures between about 1100-1125° C., falling to low $1 \times 10^{11}$/cm$^3$ for materials annealed at about 1000° C. Given the comparable concentrations of dopant materials (e.g., boron, arsenic, phosphorus) and the concentrations of excess thermal donors, material specified to be high resistivity may suffer resistivity variability, and even apparent switching from p type to n type.

Float Zone (FZ) silicon is an ultra-high purity alternative to CZ silicon. FZ can be manufactured at resistivity levels greater than 5,000 ohm-cm, greater than 7,500 ohm-cm, even greater than 10,000 ohm-cm, or even greater than 20,000 ohm-cm. The float zone process minimizes the introduction of oxygen into the growing single crystal and can advantageously minimize oxygen thermal double donor formation, new thermal donor formation and excess thermal donor formation. The attendant reduction in thermal donor formation minimizes resistivity variability axially and radially in the ingot and wafers sliced therefrom. This can both improve device performance and resistivity stability.

The HRSOI wafer is also subject to parasitic conduction at the interface between the buried oxide layer (BOX) and the high resistivity substrate that can extend more than 10 microns into the underlying high resistivity substrate. It is caused by the combination of normal oxide charges in the BOX and the very low doping concentration of the substrate. The parasitic surface conduction effect shown in FIG. 1, referred to in the literature as PSC, causes the effective substrate resistivity to be lower and increases RF losses, substrate non-linearity, and cross talk. Placement of a trap rich layer 28 (with reference to FIG. 2) between the BOX 24 and the high resistivity substrate 22 prevents the parasitic conduction layer 12 (with reference to FIG. 1) from forming by the traps capturing free carriers attracted to the BOX/substrate interface, suppressing the formation of an accumulation or inversion layer. When combining the trap rich layer with a stable Float Zone silicon handle wafer having resistivity greater than 5,000 ohm-cm, greater than 7,500 ohm-cm, greater than 10,000 ohm-cm, greater than 20,000 ohm-cm, or greater than 30,000 ohm-cm superior RF performance, such as second harmonic distortion or HD2 values of better than −80 dBm, better than −90 dBm, better than −100 dBm, or better than −110 dBm can be achieved. See FIG. 3 depicting harmonic distortion as a function of substrate resistivity in HR-SOI structures employing a trap rich layer. As shown therein, higher resistivity wafers demonstrate better HD2 values. More specifically, second harmonic distortion or HD2 values of better than better than −100 dBm, or even better than −110 dBm are achievable with SOI structures having float zone handle substrates having resistivity values greater than 20,000 ohm-cm, or greater than 30,000 ohm-cm.

The use of a Float Zone handle wafer is intended to solve multiple problems; 1) FZ provides a manufacturable crystal growth path to resistivity target levels greater than 5,000 ohm-cm, greater than 7,500 ohm-cm, greater than 10,000 ohm-cm, greater than 20,000 ohm-cm, or greater than 30,000 ohm-cm which enables improved RF performance when coupled with trap rich layer, and 2) FZ has oxygen content below the limits of detection, which reduces and may eliminate electrically active thermal donor and excess thermal donor formation and as a result prevents resistivity shifts that can degrade RF electrical performance and interfere with processing of wafers in the device fabrication line. Float Zone silicon is grown by vertical zone melting/refinement of a high purity polycrystalline rod. A seed crystal is placed at one end of the rod to initiate monocrystalline growth. The process avoids the use of a containment vessel which greatly reduces the introduction of impurities including oxygen. Eliminating oxygen effects such as thermal donor formation is essential in ultra-high resistivity silicon. Nitrogen is typically intentionally added during FZ growth to control point defect formation and to improve its mechanical strength. The doping level and dopant type of ultra-high resistivity FZ depend on the purity of the polycrystalline source rod.

I. Float Zone Handle Wafer

Figure 2:
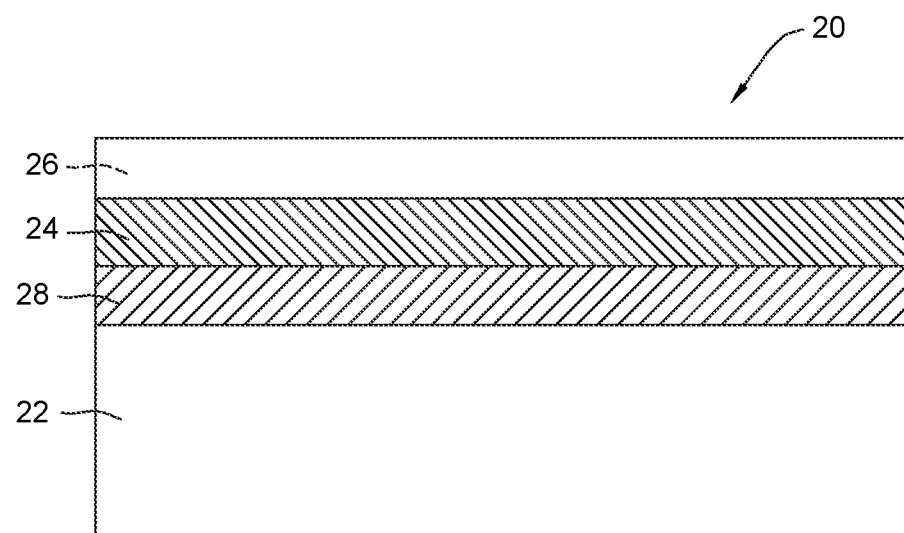
FIG. 2 is a depiction of a silicon-on-insulator wafer according to the prior art, the SOI wafer comprising a polycrystalline silicon trap rich layer between a high resistivity substrate and a buried oxide layer.
Figure 3:
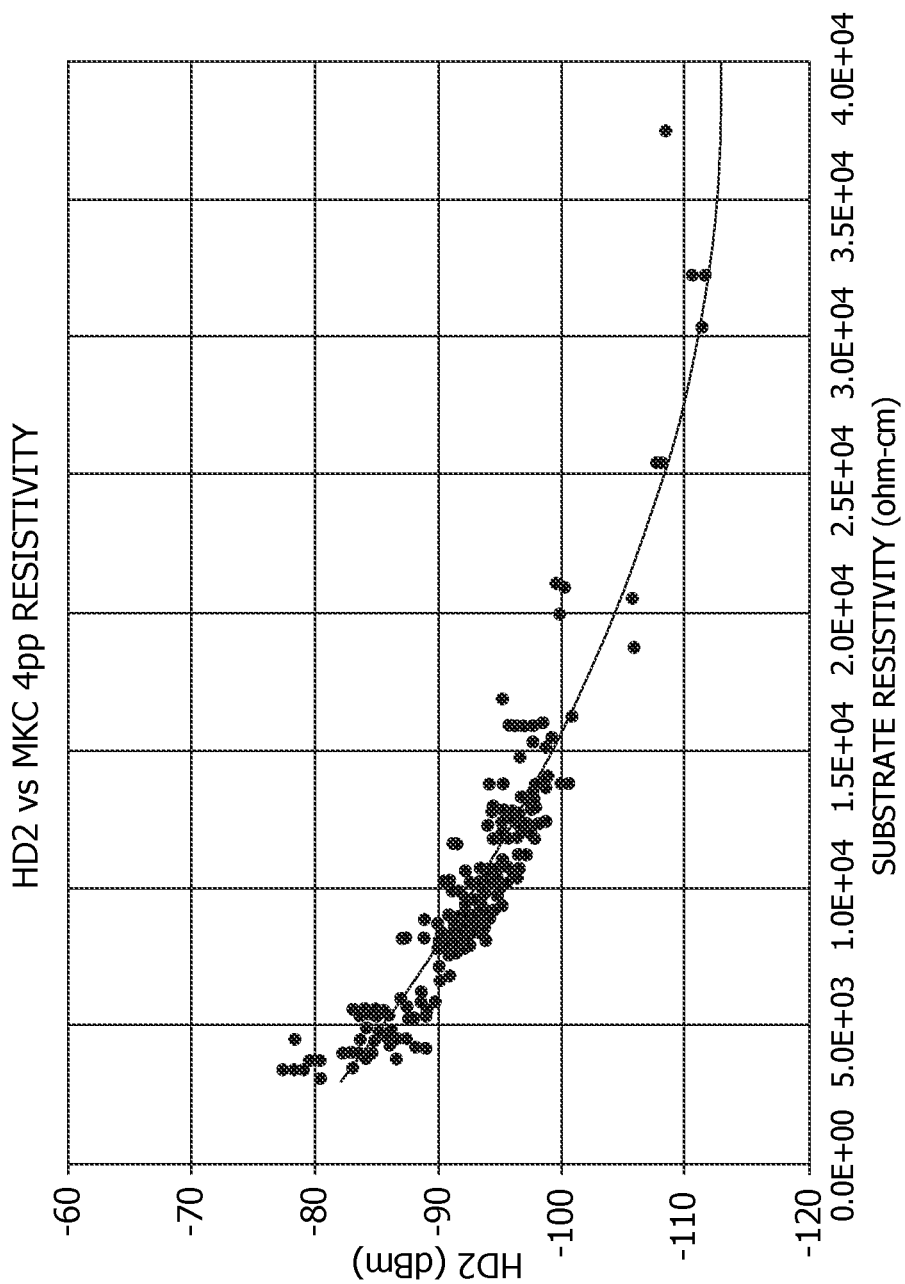
FIG. 3 is a graph depicting harmonic distortion as a function of substrate resistivity in HR-SOI structures employing a trap rich layer.

According to the present invention, a wafer sliced from a single crystal silicon ingot grown by the float zone method is integrated as a high resistivity handle structure into a semiconductor-on-insulator (e.g., silicon-on-insulator) multilayer structure 20 having the structure shown in FIG. 2. That is, the semiconductor-on-insulator (e.g., silicon-on-insulator) multilayer structure 20 comprises a float zone high resistivity handle substrate (e.g., semiconductor handle substrate 22), e.g., a wafer, a trap rich layer 28, a dielectric layer 24, and a device layer 26.

The substrates for use in the present invention include a semiconductor handle substrate, e.g., a single crystal semiconductor handle wafer and a semiconductor donor substrate, e.g., a single crystal semiconductor donor wafer. The semiconductor device layer 26 in a semiconductor-on-insulator multilayer structure 20 is derived from the single crystal semiconductor donor wafer. The semiconductor device layer 26 may be transferred onto the semiconductor handle substrate 22 by wafer thinning techniques such as etching a semiconductor donor substrate or by cleaving a semiconductor donor substrate comprising a damage plane.

In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, a bulk region between the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. It is upon this front surface that the trap rich layer is formed. Accordingly, a "back surface" of a single crystal semiconductor handle substrate, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure. The front surface of a single crystal semiconductor donor substrate often comprises a dielectric layer, e.g., a silicon dioxide layer, which forms a portion of or all of the buried oxide (BOX) layer in the final structure. A "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

Handle wafers comprises a material, e.g., silicon, derived from an ingot grown by the float zone method. The single crystal silicon handle wafer sliced from an ingot grown by the float zone method typically has a nominal diameter of at least about 20 mm, at least about 50 mm, at least about 100 mm, at least about 150 mm, at least about 200 mm, such as about 150 mm, or about 200 mm. Surface tension limitations during the growth process commonly result in diameters not greater than 250 mm, or about 200 mm. Handle wafer thicknesses may vary from between about 100 micrometers and about 5000 micrometers, such as between about 100 micrometers and about 1500 micrometers, such as between about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In some embodiments, the float zone crystal ingot and single crystal semiconductor handle substrate sliced therefrom has a bulk resistivity of a bulk resistivity of at least about 5,000 ohm-cm, at least about 7,500 ohm-cm, such as at least about 10,000 ohm-cm, at least about 15,000 ohm-cm, or at least about 20,000 ohm-cm, at least about 25,000 ohm-cm, or even at least about 30,000 ohm-cm. In some embodiments, the single crystal semiconductor handle substrate has a bulk resistivity of less than about 100,000 ohm-cm. High resistivity wafers may comprise electrically active dopants, such as boron (p type), gallium (p type), aluminum (p type), indium (p type), phosphorus (n type), antimony (n type), and arsenic (n type), in generally very low concentrations, e.g., less than $1 \times 10^{12}$ atoms/cm$^3$, or even less than $1 \times 10^{11}$ atoms/cm$^3$. Methods for preparing high resistivity wafers from float zone single crystal silicon ingots are known in the art, and such high resistivity wafers may be obtained from commercial suppliers, such as Global-Wafers Co., Ltd., Taiwan.

Silicon handle wafers derived from float zone grown ingots can be more reliably targeted to ultra-high resistivity values with minimum to maximum variation of around ~2×. For example, a two sided min-max specification for wafer resistivity can be accepted such as 10,000-20,000 ohm-cm or tighter, unlike in UHR Cz wafers where the specs are generally one sided, such as >=7500 ohm-cm. Tolerances of +/−30-50% around a target value may be acceptable. This will enable the end user to have not only improved RF electrical performance level (as shown in FIG. 3), but it will also be more predictable and less variable when compared with Czochralski grown silicon. The fundamental reason for this solution is that float zone grown silicon handle wafers have an oxygen concentration below the detectable limit and thereby avoids the thermal donor formation and excess thermal donor formation that causes variability in ultra-high resistivity Czochralski grown silicon. In some embodiments, the float zone grown silicon handle wafers have an oxygen level that is below the detection limits, such as less than about $2.5 \times 10^{16}$ atoms/cm$^3$ (0.5 PPMA, new ASTM standard), less than about $2 \times 10^{16}$ atoms/cm$^3$ (0.4 PPMA, new ASTM standard), less than about $1 \times 10^{16}$ atoms/cm$^3$ (0.2 PPMA, new ASTM standard), or even less than about $1 \times 10^{15}$ atoms/cm$^3$ (0.02 PPMA, new ASTM standard), of metrology methods and eliminates the presence of oxygen thermal donors and excess donors formed in Czochralski grown silicon wafers, which comprise a detectable oxygen concentration. In some embodiments, the silicon handle wafers have an excess thermal donor concentration of less than $1 \times 10^{11}$ donors/cm$^3$, or even less than $5 \times 10^{10}$ donors/cm$^3$. In some embodiments, the oxygen concentration is so low a double donor thermal donor concentration, new thermal donor concentration, and/or an excess thermal donor concentration is below detectable limits, and a first approximation would be that the concentration of such donors may be at least an order of magnitude less than the p-type acceptor or n-type donor concentrations. Stated another way, the concentration of any of the double donor thermal donor concentration, new thermal donor concentration, and/or an excess thermal donor concentration or the sum of the double donor thermal donor concentration, new thermal donor concentration, and/or an excess thermal donor concentration is at least an order of magnitude less than the p-type acceptor or n-type donor concentrations, i.e., less than ¹⁄₁₀ of the concentration of p-type or n-type dopants. In CZ the thermal donors and excess can be lower than, equal to, or higher than the background doping concentration, dependent on the oxygen concentration and the thermal cycle details. The thermal double donor concentration in CZ Si will keep increasing with anneal time at ~450° C. to quite large values. The concentration will ultimately saturate at some value that depends on the Oi. For large Oi~15 nppma, the saturation concentration can be ~$1 \times 10^{16}$/cm$^3$ or more. The saturation (maximum) TDD concentration will decrease with decreasing Oi. It will be much larger than the actual dopant concentrations involved in HR Si. The low donor concentration in FZ wafers reduce variability of RF performance, reduce the impact of resistivity variability on device fabrication processes that are sensitive to wafer resistivity (electrostatic chucking), and eliminate the sensitivity to new thermal donor formation which is another source of variability in ultra-high resistivity/low oxygen Czochralski grown silicon wafers.

Figure 4:
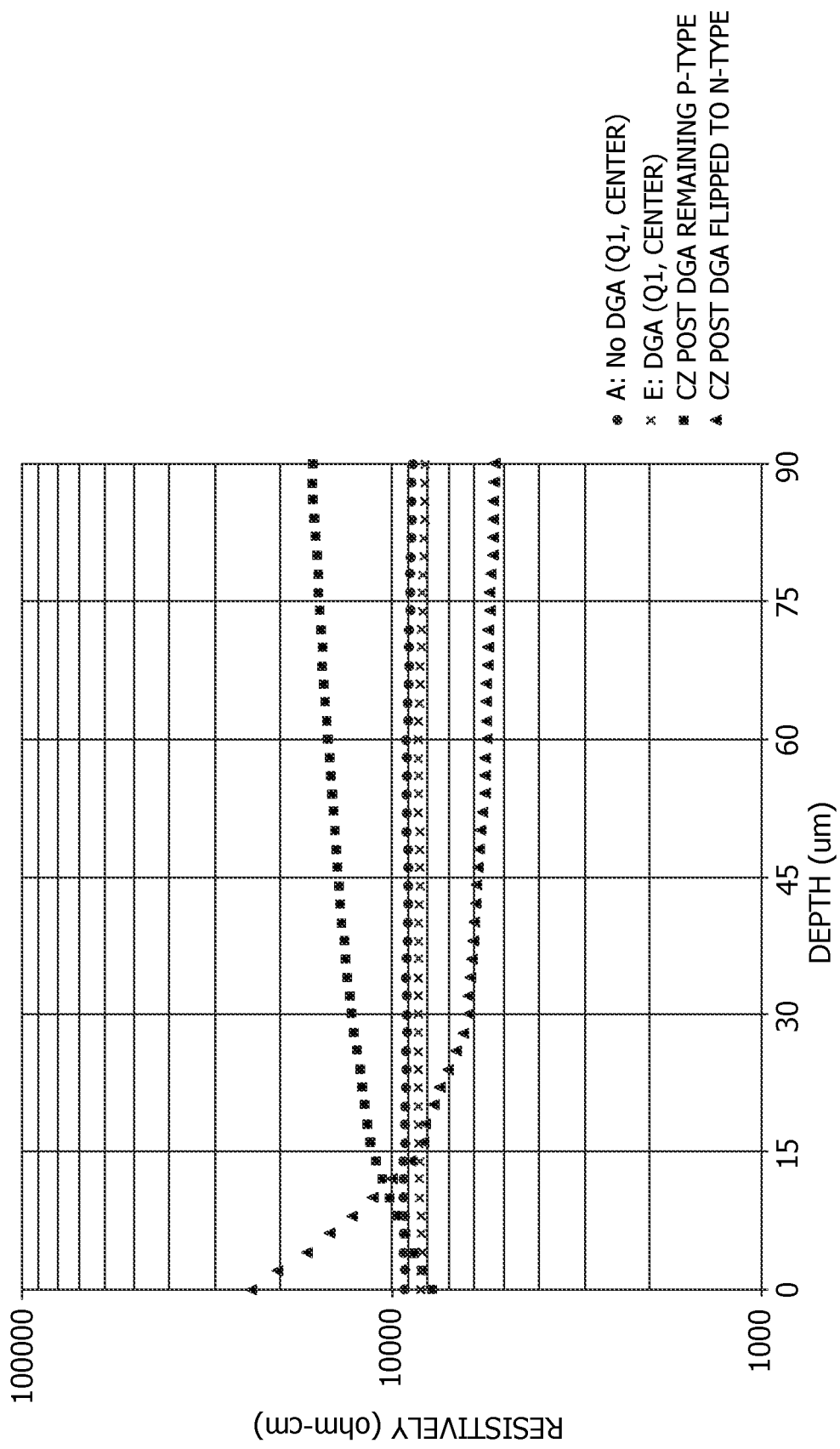
FIG. 4 is a graph depicting resistivity depth profiles of float zone grown handle wafer and Czochralski grown handle wafer after SOI processing employing a trap rich layer.
Figure 5:
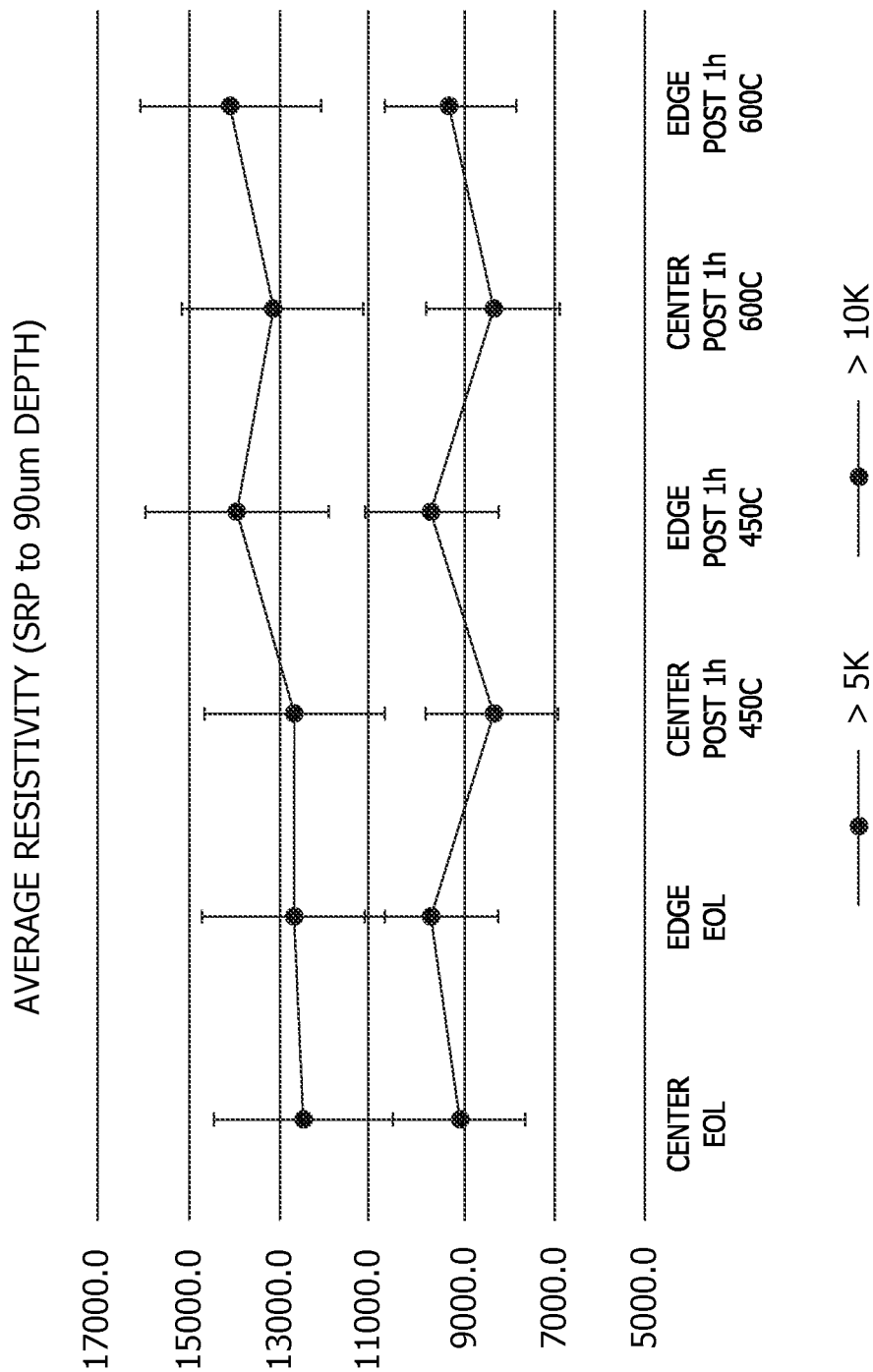
FIG. 5 is a graph depicting average resistivity of the first 90 microns below the BOX/handle interface of float zone grown handle wafer after SOI processing employing trap rich layer.

Additionally, the spreading resistance profiles (SRP) of Czochralski grown silicon handle wafers are rarely flat over the first few tens of microns below the BOX/handle interface, e.g., after a 450° C. anneal. The SRPs of Czochralski grown silicon handle wafers are often influenced by the formation of TDs and excess donor causing the profiles to vary significantly as shown in FIG. 4. The SRPs of the float zone grown silicon handle wafers, however, are very flat and show the complete absence of thermal donors and excess donors in 450° C. and 600° C. testing. See FIG. 4. On the graph in FIG. 4, the line with diamonds (♦) is the resistivity per depth of float zone handle wafer before the 450° C. donor generating anneal (DGA) anneal, and the line with X is the resistivity per depth of float zone handle wafer after the 450° C. DGA anneal. Further, on the graph, the line with the square (■) is the resistivity per depth of Czochralski grown handle wafer p-type after the 450° C. DGA anneal. Finally, on the graph, the line with the triangle (▲) is the resistivity per depth of Czochralski grown handle wafer n-type after the 450° C. DGA anneal. See also FIG. 5, depicting average resistivity of the first 90 microns below the BOX/handle interface of float zone grown handle wafer after SOI processing employing trap rich layer, the wafers having greater than 5000 ohm-cm resistivity and greater than 10,000 ohm-cm resistivity. The profiles are very flat and show the complete absence of thermal donors in 450° C. and 600° C. testing.

Since float zone grown silicon handle wafers have oxygen below detectable limits, such wafers may be more prone to slip in thermal processes. However, nitrogen may be added during growth of the float zone crystal to control point defect formation and add strength against slip. Specialized doping techniques like core doping, pill doping, gas doping with nitrogen or ammonia gas may be used to incorporate a uniform concentration of impurity. In some embodiments, the nitrogen concentration in the float zone grown silicon handle wafers may be at least about $1\times10^{13}$ atoms/cm$^3$, such as at least about $0.5\times10^{14}$ atoms/cm$^3$, at least about $1\times10^{14}$ atoms/cm$^3$. In some embodiments, the nitrogen concentration in the float zone grown silicon handle wafers may be less than about $3\times10^{15}$ atoms/cm$^3$, or less than about $1\times10^{15}$ atoms/cm$^3$, or less than about $7\times10^{14}$ atoms/cm$^3$, or less than about $3\times10^{14}$ atoms/cm$^3$. In some embodiments, the nitrogen concentration in the float zone grown silicon handle wafers may be at least about $0.5\times10^{14}$ atoms/cm$^3$ and less than about $3\times10^{14}$ atoms/cm$^3$. A demonstration of nitrogen-doped float zone grown silicon handle wafers in SOI manufacturing line showed acceptable slip performance nearly on equal to Czochralski grown silicon handle wafers.

In this regard, float zone grown silicon handle wafers and Czochralski grown silicon handle wafers were subjected to oxidation at 800° C., followed by a 2 hour anneal cycle at 1100° C., followed by slip inspection. The result was that no slip was found on either wafer type. Accordingly, a nitrogen doped float zone handle wafer can survive the thermal cycles associated with trap rich layer deposition and subsequent SOI wafer fabrication with no slip. In another furnace push test, a furnace was heated to 1000° C., and float zone grown silicon handle wafers and Czochralski grown silicon handle wafers were rapidly pushed through the furnace. Both wafer types behaved similarly under this slip test.

In some embodiments, the front surface, back surface, or both the front and the back surface of the single crystal semiconductor handle substrate may be subjected to a process, e.g., an oxidation process, to thereby grow a dielectric layer, such as a semiconductor oxide layer, a semiconductor nitride layer, or a semiconductor oxynitride layer. In some embodiments, the dielectric layer comprises silicon dioxide, which may be formed by oxidizing the front surface of the silicon handle substrate. This may be accomplished by thermal oxidation (in which some portion of the deposited semiconductor material film will be consumed) and/or CVD oxide deposition and/or atomic layer deposition. In some embodiments, the semiconductor handle substrate may be thermally oxidized in a furnace such as an ASM A400. The temperature may range from 750° C. to 1100° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% oxygen (a "dry oxidation"). In some embodiments, the oxidizing ambient atmosphere may oxygen and ammonia, which is suitable for depositing silicon oxynitride. In some embodiments, the ambient atmosphere may comprise a mixture of inert gas, such as Ar or $N_2$, and oxidizing gases, such as $O_2$ and water vapor (a "wet oxidation"). In some embodiments, the ambient atmosphere may comprise a mixture of inert gas, such as Ar or $N_2$, and oxidizing gas, such as $O_2$ and water vapor (a "wet oxidation"), and a nitriding gas, such as ammonia. In some embodiments, the ambient atmosphere may comprise a mixture of inert gas, such as Ar or $N_2$, and a nitriding gas, such as ammonia, which is suitable for depositing silicon nitride. In an exemplary embodiment, semiconductor handle wafers may be loaded into a vertical furnace, such as an A400. The temperature is ramped to the oxidizing temperature with a mixture of $N_2$ and $O_2$. At the desired temperature water vapor is introduced into the gas flow. After the desired oxide thickness has been obtained, the water vapor and $O_2$ are turned off and the furnace temperature is reduced and wafers are unloaded from the furnace. The oxidation layer on the front surface, the back surface, or both may be between about 100 angstroms and about 100,000 angstroms, between about 100 angstroms and about 10,000 angstroms, between about 100 angstroms and about 1000 angstroms, such as between about 100 angstroms and about 700 angstroms, or between about 100 angstroms and about 500 angstroms, or between about 100 angstroms and about 250 angstroms.

In some embodiments, the oxidation layer is relatively thin, such as between about 5 angstroms and about 25 angstroms, such as between about 10 angstroms and about 15 angstroms. Thin oxide layers can be obtained on both sides of a semiconductor wafer by exposure to a standard cleaning solution, such as an SC1/SC2 cleaning solution. In some embodiments, the SC1 solution comprises 5 parts deionized water, 1 part aqueous $NH_4OH$ (ammonium hydroxide, 29% by weight of $NH_3$), and 1 part of aqueous $H_2O_2$ (hydrogen peroxide, 30%). In some embodiments, the handle substrate may be oxidized by exposure to an aqueous solution comprising an oxidizing agent, such as an SC2 solution. In some embodiments, the SC2 solution comprises 5 parts deionized water, 1 part aqueous HCl (hydrochloric acid, 39% by weight), and 1 part of aqueous $H_2O_2$ (hydrogen peroxide, 30%).

II. Trap Rich Layers

According to the method of the present invention, a trap rich layer comprising a polycrystalline or amorphous semiconductor material is deposited onto the exposed front surface of the single crystal semiconductor handle wafer. Semiconductor material suitable for use in forming a trap rich layer in a semiconductor-on-insulator device is suitably capable of forming a highly defective layer in the fabricated device. Such materials include polycrystalline semiconductor materials and amorphous semiconductor materials. Materials that may be polycrystalline or amorphous include silicon (Si), silicon germanium (SiGe), silicon doped with carbon (SiC), and germanium (Ge). Polycrystalline silicon denotes a material comprising small silicon crystals having random crystal orientations. Polycrystalline silicon grains may be as small in size as about 20 nanometers. According to the method of the present invention, the smaller the crystal grain size of polycrystalline silicon deposited the higher the defectivity in the trap rich layer. Amorphous silicon comprises a non-crystalline allotropic form of silicon, which lacks short range and long range order. Silicon grains having crystallinity over no more than about 10 nanometers may also be considered essentially amorphous. Silicon germanium comprises an alloy of silicon germanium in any molar ratio of silicon and germanium. Silicon doped with carbon comprises a compound of silicon and carbon, which may vary in molar ratio of silicon and carbon. The resistivity of the polycrystalline silicon trap rich layer may be at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 8,000 Ohm-cm.

The material for deposition onto the, optionally oxidized, front surface of the single crystal semiconductor handle wafer may be deposited by means known in the art. For example, the semiconductor material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. For example, polycrystalline silicon may be deposited onto the surface oxidation layer by pyrolyzing silane ($SiH_4$) in a temperature range between about 550° C. and about 690° C., such as between about 580° C. and about 650° C. The chamber pressure may range from about 70 to about 400 mTorr. Amorphous silicon may be deposited by plasma enhanced chemical vapor deposition (PECVD) at temperatures generally ranging between about 75° C. and about 300° C. Silicon germanium, particularly amorphous silicon germanium, may be deposited at temperatures up to about 300° C. by chemical vapor deposition by including organogermanium compounds, such as isobutylgermane, alkylgermanium trichlorides, and dimethylaminogermanium trichloride. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the silicon layer may comprise a carbon concentration of at least about 1% on an atomic basis, such as between about 1% on an atomic basis and about 10% on an atomic basis.

In some embodiments, the deposition of the semiconductor material of the trap rich layer may be temporarily interrupted, at least once and preferably more than once, in order to prepare multiple layers of trap rich material. The interim surface of the semiconductor material film may be exposed to inert, oxidizing, nitridizing, or passivating atmosphere to thereby poison or passivate the deposited semiconductor material. Stated another way, the method of the present invention may comprise deposition of a multilayer of trap rich semiconductor material by a cycling process in which semiconductor material is deposited, deposition is interrupted, the layer of semiconductor material is poisoned or passivated, and the next layer of semiconductor material is deposited. In some embodiments, a multilayer may be formed comprising one passivated semiconductor layer and one additional semiconductor layer may be deposited to form the trap rich layer. In some embodiments, the multilayer comprises more than one passivated semiconductor layer and one additional semiconductor layer in the trap rich layer. By depositing the trap rich layer in this way, a multilayer comprising, for example, one or more passivated layers, or two or more passivated layers, such as three or more passivated layers, such as at least four passivated layers, or between four and about 100 passivated layers, or between four and about 60 passivated layers, or between four and about 50 passivated layers, or between four and about 25 passivated layers, or between six and about 20 passivated layers of semiconductor material is deposited onto the handle substrate. A large number of semiconductor layers may be deposited limited in part by throughput demands and by the smallest practical layer thickness that may be deposited, which is currently about 20 nanometers.

Each of these layers of semiconductor material is poisoned or passivated such that during the high temperature processes of semiconductor-on-insulator fabrication, crystal grain growth in each layer of the multilayer is limited by the thickness of the passivated multilayer rather than by the thickness of the overall trap rich layer as in prior art processes. In some embodiments, the semiconductor layers may be passivated by exposing the first semiconductor layer to an atmosphere comprising a nitrogen-containing gas, such as nitrogen, nitrous oxide, ammonia ($NH_3$), nitrogen plasma, and any combination thereof. In this regard, the atmosphere in which the semiconductor layer is deposited may comprise a nitrogen-containing gas, such as nitrogen, and termination of the deposition process followed by exposure to the gas may be sufficient to form a thin passivation layer over the semiconductor layer. In some embodiments, the chamber may be evacuated of the deposition gas and purged with the nitrogen containing gas in order to effect passivation of the previously deposited semiconductor layer. Exposure to nitrogen may nitride the deposited semiconductor layer, for example, resulting in the formation of a thin layer of silicon nitride of just a few angstroms thickness. Alternative passivation methods may be used. For example, the semiconductor layer may be passivated by exposing the first semiconductor layer to an atmosphere comprising an oxygen containing gas, such as oxygen, ozone, water vapor, or any combination thereof. According to these embodiments, a thin layer of semiconductor oxide may form on the semiconductor layer, the semiconductor oxide being sufficient to passivate the layer. For example, a thin layer of silicon oxide may be formed between each layer of the multilayer. The oxide layer may be only a few angstroms thick, such as between about 1 angstrom and about 20 angstroms, or between about 1 angstrom and about 10 angstroms. In some embodiments, air, which comprises both nitrogen and oxygen, may be used as the passivated gas. In some embodiments, the semiconductor layers may be passivated by exposing the first semiconductor layer to a liquid selected from the group consisting of water, peroxide (e.g. hydrogen peroxide solution), or SC1 solution ($NH_3:H_2O_2:H_2O$).

The overall thickness of the trap rich layer may be between about 0.3 micrometers and about 5 micrometers, such as between about 0.3 micrometers and about 3 micrometers, such as between about 0.3 micrometers and about 2 micrometers or between about 2 micrometers and about 3 micrometers.

In some embodiments, deposition of the trap rich layer is followed by formation of a dielectric layer on the surface of the trap rich layer. In some embodiments, the single semiconductor handle substrate (e.g., single crystal silicon handle substrate) is oxidized to form a semiconductor oxide (e.g., a silicon dioxide) film on the trap rich layer. In some embodiments, the trap rich layer, e.g., polycrystalline film, may be thermally oxidized (in which some portion of the deposited semiconductor material film will be consumed) or the semiconductor oxide (e.g., silicon dioxide) film may be grown by CVD oxide deposition. The oxide layer (e.g., silicon dioxide layer) in contact with the polycrystalline or amorphous trap rich layer (e.g., a polycrystalline or amorphous silicon trap rich layer) may have a thickness between about 0.1 micrometer and about 10 micrometers, such as between about 0.1 micrometers and about 4 micrometers, such as between about 0.1 micrometers and about 2 micrometers, or between about 0.1 micrometers and about 1 micrometer. The oxidation process additionally oxidizes the back surface of the single crystal semiconductor handle wafer, which advantageously reduces warp and bow potentially caused by the different coefficients of thermal expansion of silicon and silicon dioxide.

III. Preparation of the Bonded Structure

The single crystal semiconductor handle wafer, such as a single crystal silicon handle wafer, prepared according to the float zone method is next bonded to a single crystal semiconductor donor wafer, which is prepared according to conventional layer transfer methods. In preferred embodiments, the single crystal semiconductor donor wafer comprises a material selected from the group consisting of silicon, silicon carbide, silicon germanium, gallium arsenide, gallium nitride, indium phosphide, indium gallium arsenide, germanium, and combinations thereof. Donor wafers may be sliced from an ingot prepared by the float zone or the Czochralski method. Wafer thicknesses may vary from between about 100 micrometers and about 5000 micrometers, such as between about 100 micrometers and about 1500 micrometers, such as between about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers. Depending upon the desired properties of the final integrated circuit device, the single crystal semiconductor (e.g., silicon) donor wafer may comprise electrically active dopants, such as boron (p type), gallium (p type), aluminum (p type), indium (p type), phosphorus (n type), antimony (n type), and arsenic (n type). The resistivity of the single crystal semiconductor (e.g., silicon) donor wafer may range from 1 to 100 Ohm-cm, 1 to 50 Ohm-cm, or from 5 to 25 Ohm-cm. The single crystal semiconductor donor wafer may be subjected to standard process steps including oxidation, implant, and post implant cleaning. Accordingly, a single crystal semiconductor donor wafer that has been etched and polished and optionally oxidized is subjected to ion implantation to form a damage layer in the donor substrate.

In some embodiments, the single crystal semiconductor donor wafer comprises a dielectric layer. The dielectric layer may comprise one or more insulating layers formed on the front surface of the single crystal semiconductor donor wafer. The insulating layer may comprise a material selected from the group consisting of silicon dioxide, silicon nitride, and silicon oxynitride. In some embodiments, the insulating layer may comprise a material selected from the group consisting of $Al_2O_3$, AlN, or a combination thereof. In some embodiments, the dielectric layer comprises multiple layers of insulating material, although other configurations are within the scope of this invention. Each insulating layer may comprise a material selected from the group consisting of silicon dioxide, silicon nitride, and siliconoxynitride. In some embodiments, the dielectric layer comprises three layers of insulating material, in the order of silicon dioxide, silicon nitride, and silicon dioxide. Each insulating layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

Ion implantation may be carried out in a commercially available instrument, such as an Applied Materials Quantum II, Quantum H, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/$cm^2$ to about $10^{17}$ ions/$cm^2$, such as from about $10^{14}$ ions/$cm^2$ to about $10^{17}$ ions/$cm^2$, such as from about $10^{15}$ ions/$cm^2$ to about $10^{17}$ ions/$cm^2$, or from about $10^{16}$ ions/$cm^2$ to about $10^{17}$ ions/$cm^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer transferred to the handle in the SOI process. The ions may be implanted to a depth between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor wafer having an ion implant region therein formed by $He^+$, $H^+$, $H_2^+$, and any combination thereof ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is optionally cleaned.

In some embodiments, the ion-implanted and optionally cleaned and optionally annealed single crystal semiconductor donor wafer is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface of the single crystal semiconductor donor wafer and the front surface of single crystal semiconductor handle wafer are next brought into intimate contact to thereby form a bonded structure. According to the methods of the present invention, each of the front surface of the single crystal semiconductor donor wafer and the front surface of single crystal semiconductor handle wafer may comprise one or more insulating layers. The insulating layers form the dielectric layer of the bonded structure.

Since the mechanical bond may be relatively weak, the bonded structure may be further annealed to solidify the bond between the single crystal semiconductor donor wafer and the single crystal semiconductor handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some embodiments, the bonded structure is annealed at a temperature of from about 200° C. to about 400° C., from about 300° C. to about 400° C., such as from about 350° C. to about 400° C.

In some embodiments, the anneal may occur at relatively high pressures, such as between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa. In conventional bonding methods, the temperature is likely limited by thermal cleaving. This occurs when the pressure of the platelets at the implant plane exceeds the external isostatic pressure. Accordingly, conventional anneal may be limited to bonding temperatures between about 350° C. and about 400° C. because of thermal cleave. After implantation and bond, the wafers are weakly held together. But the gap between the wafers is sufficient to prevent gas penetration or escape. Weak bonds can be strengthened by heat treatments, but the cavities formed during implant are filled with gas. While heating, the gas inside the cavities pressurizes. It is estimated that the pressure may reach 0.2-1 GPa (Cherkashin et al., J. Appl. Phys. 118, 245301 (2015)), depending on the dosage. When the pressure exceeds a critical value, the layer delaminates. This is referred to as a thermal cleave. It prevents higher temperature or longer time in the anneal. According to some embodiments of the present invention, bonding occurs at elevated pressures, e.g., between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa, which thereby enables bonding at elevated temperatures. In some embodiments, the bonded structure is annealed at a temperature of from about 300° C. to about 700° C., from about 400° C. to about 600° C., such as between about 400° C. and about 450° C., or even between about 450° C. and about 600° C., or between about 350° C. and about 450° C. Increasing the thermal budget will have a positive effect on the bond strength. Thermal annealing may occur for a duration of from about 0.5 hours to about 10 hours, such as between about 0.5 hours and about 3 hours, preferably a duration of about 2 hours. Thermal annealing within these temperatures ranges is sufficient to form a thermally activated cleave plane. In conventional bonding anneals, the edge of both the handle wafer and donor wafer may become far apart due to the roll off. In this area, there is no layer transfer. It is called the terrace. Pressurized bonding is expected to reduce this terrace, extending the SOI layer further out towards the edge. The mechanism is based on trapped pockets of air being compressed and "zippering" outwards. After the thermal anneal to activate the cleave plane, the bonded structure may be cleaved.

After the thermal anneal, the bond between the single crystal semiconductor donor wafer and the single crystal semiconductor handle wafer is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 26, preferably a silicon device layer, on the semiconductor-on-insulator multilayer structure 20. See FIG. 2.

After cleaving, the cleaved structure may be subjected to a high temperature anneal in order to further strengthen the bond between the transferred device layer 26 and the single crystal semiconductor handle wafer 22. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas. In some embodiments, the semiconductor device layer 26 may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

In some embodiments, an epitaxial layer may be deposited on the transferred single crystal semiconductor device layer 26. A deposited epitaxial layer may comprise substantially the same electrical characteristics as the underlying single crystal semiconductor device layer 26. Alternatively, the epitaxial layer may comprise different electrical characteristics as the underlying single crystal semiconductor device layer 26. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise electrically active dopants, such as boron (p type), gallium (p type), aluminum (p type), indium (p type), phosphorus (n type), antimony (n type), and arsenic (n type). The resistivity of the epitaxial layer may range from 1 to 1050 Ohm-cm, 1 to 50 Ohm-cm, typically, from 5 to 25 Ohm-cm. In some embodiments, the epitaxial layer may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

The finished SOI multilayer structure comprises the single crystal semiconductor handle wafer 22, the trap rich layer 28, the dielectric layer 24, and the semiconductor device layer 26, may then be subjected to end of line metrology inspections and cleaned a final time using typical SC1-SC2 process. Accordingly, the present invention is directed to an SOI multilayer structure comprising a trap rich layer and a handle substrate made with nitrogen doped, high resistivity (>20 kΩ-cm) Float Zone material. The float zone wafer provided better resistivity stability over typical BEOL anneals than a standard Czochralski handle wafer. The higher resistivity achievable using the FZ process enables a step change improvement in substrate RF loss, cross talk and harmonic distortion not easily attained with traditional CZ silicon materials. We report the first demonstration of a FZ CTLSOI substrate having an HD2 of −110 dBm on our CPW structures.

The invention is further illustrated by the following non-limiting Examples.

Example 1. Float Zone Wafers

Wafers from a commercially grown 200 mm high resistivity, nitrogen doped Float Zone crystal were used in this study. Resistivity of the wafers were greater than 20 kΩ-cm. Oxygen concentration within the wafers was less than $1 \times 10^{16}$ atoms/cm$^3$. Wafers with varying levels of nitrogen were evaluated for mechanical strength of the wafer, and the nitrogen concentration ranged from $0.5 \times 10^{14}$/cm$^3$ to $3 \times 10^{14}$/cm$^3$. The FZ wafers then had the trap rich layer deposited on them. The wafers were then processed into SOI wafers under a high volume manufacturing (HVM) process flow. At the end of the SOI wafer manufacturing flow, the wafers were subjected to the standard quality inspections including surface inspection using KLA Tencor SP1, flatness, and shape measurements using ADE 9700, and slip inspection.

Example 2. Slip Stress Testing

Figure 6:
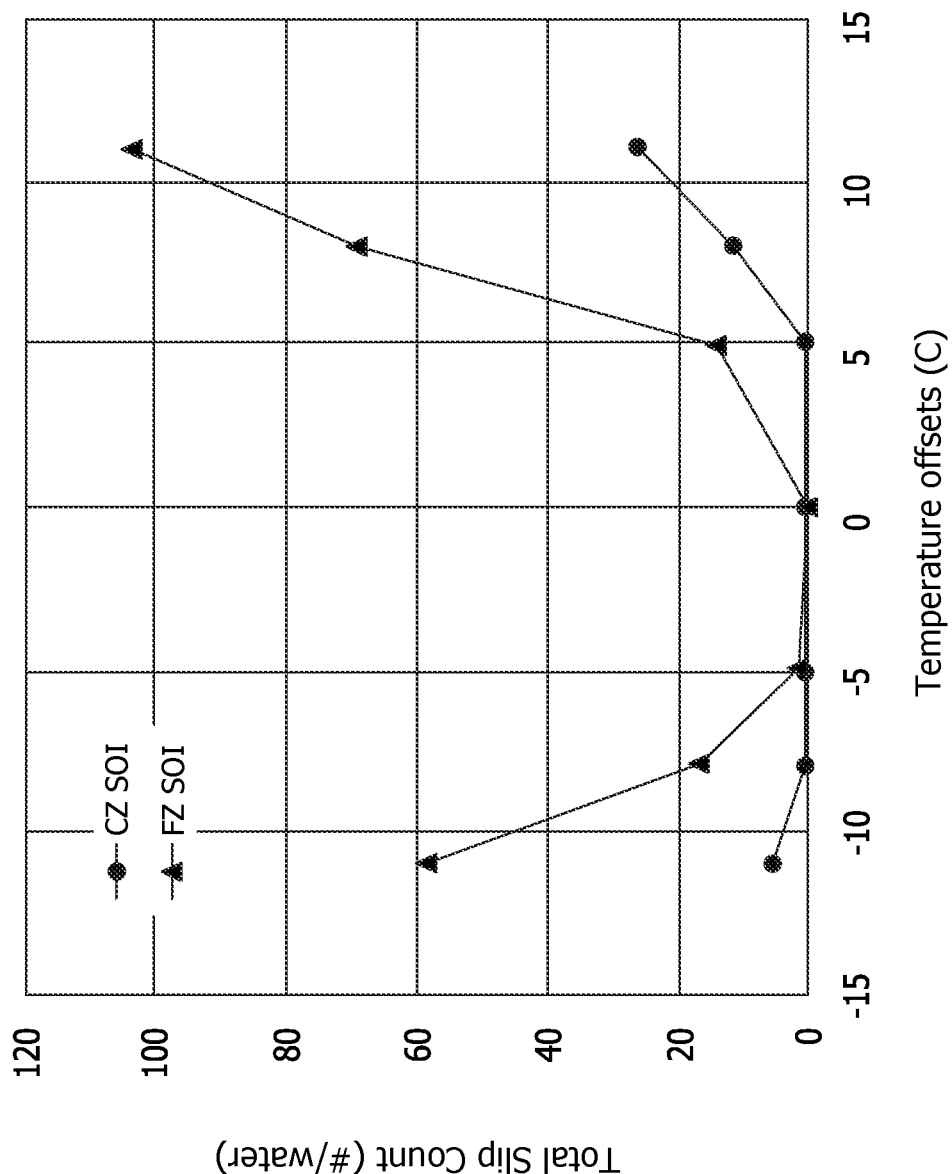
FIG. 6 is a graph depicting comparing the slip window of SOI multilayer structures in which the handle substrates are made using the Float Zone method or the Czochralski method.

SOI wafer manufactured with handle substrates prepared by the float zone method having low nitrogen concentration and higher nitrogen concentration were subjected to an enhanced thermal stressing test by forcing varying radial thermal gradient on the wafers to simulate a rapid thermal process (RTP) thermal cycle. The purpose of the thermal stressing was to intentionally induce slip in the wafers and test the robustness of the mechanical strength of the SOI structures having FZ handle substrates vs SOI wafers having handle substrates prepared by the Czochralski (CZ) method. The SOI structures prepared on CZ wafers with interstitial oxygen Oi~3.5 PPMA (new-ASTM) were intermixed as control wafers. It is found that while the UHR SOI structures having FZ handle substrates showed a slip free "window" of induced thermal gradients that is considered adequate for safe processing in subsequent device manufacturing process flows, the window was not quite as wide as for higher oxygen CZ wafers. See FIG. 6, which compares the slip window of SOI multilayer structures in which the handle substrates are made using the Float Zone method or the Czochralski method. Within the range of nitrogen tested in these wafers, there is a slight improvement with the higher N concentration.

Example 3. Resistivity Stability

Figure 7:
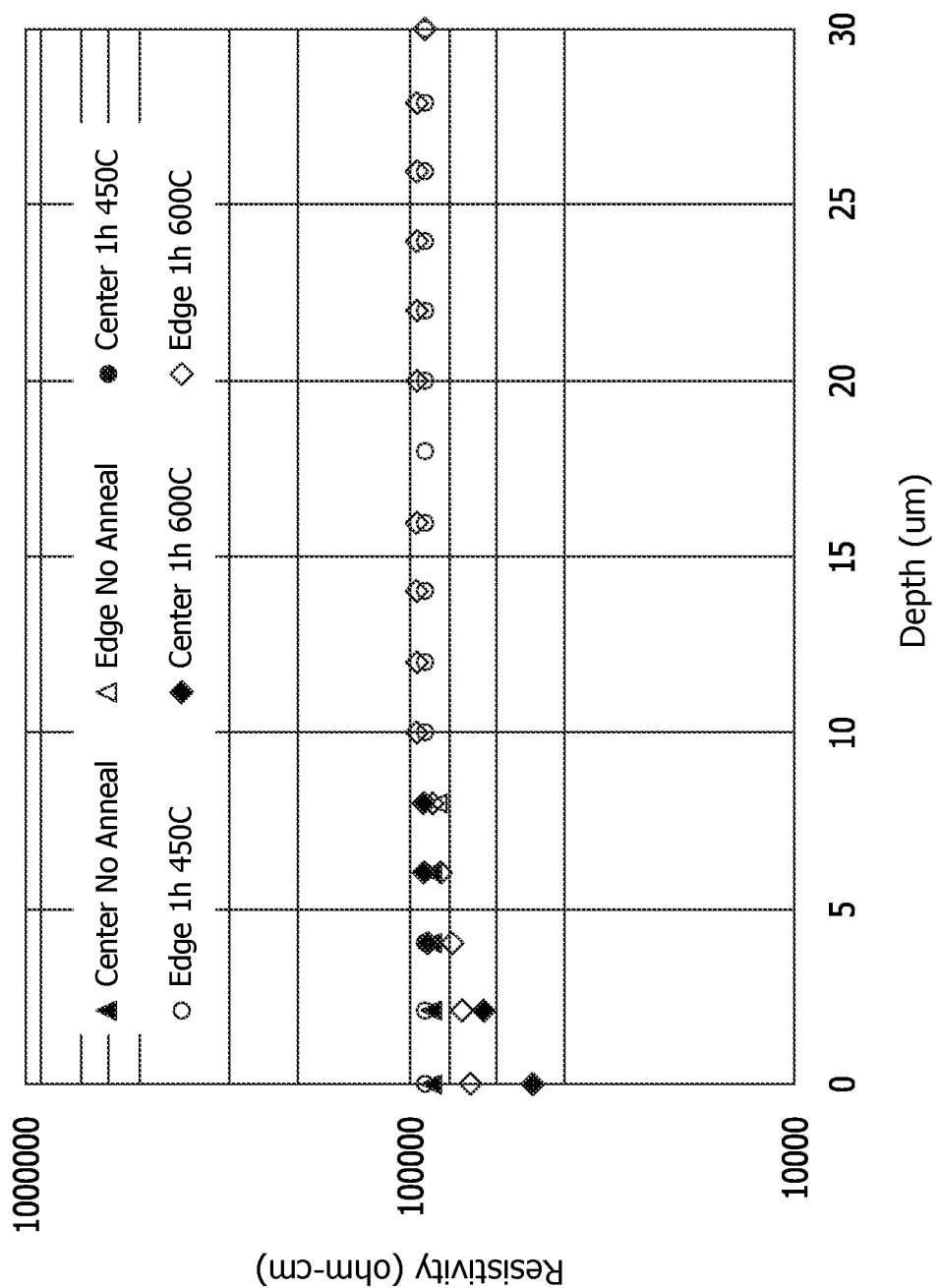
FIG. 7 is a graph depicting the resistivity of SOI multilayer structures in which the handle substrates are made using the Float Zone method under varying anneal conditions.

Spreading resistance profile (SRP) measurements were taken at the end of line to verify the resistivity stability of the wafers. The resistivity of SOI wafers having handle substrates prepared by the Czochralski (CZ) method containing oxygen form thermal double donors at temperatures in the range of 350° C.-500° C. with the generation rate strongly peaked at approximately 450° C. This can lead to a lowering of the resistivity in the handle wafer during BEOL metal anneal processes which often fall into this temperature range. SOI structures having FZ handle substrates, since they have virtually no oxygen, are immune to these changes in resistivity. See FIG. 7, which shows that, as expected, the resistivity of the SOI structures having FZ handle substrates remains the same before and after a 1 h 450° C. anneal. In addition, since the FZ handle substrates are Nitrogen doped an anneal for 1 h 600° C. was done to verify no N—O related donors are formed as would be expected in CZ silicon if both Oxygen and nitrogen are present.

Example 4. Harmonic Distortion

Radiofrequency (RF) testing was performed on several SOI structures having FZ handle substrates. The top silicon layer of the SOI wafer was removed (via wet chemical etching) and co-planar waveguide structures were fabricated directly on the BOX layer. The second harmonic distortion (HD2) and the third harmonic distortion (HD3) were measured vs input power at input powers up to 35 dBm. Devices were tested across the diameter of the wafer to determine radial uniformity of results. The results were then compared to similarly fabricated-planar waveguide structures on SOI wafers having handle substrates prepared by the Czochralski method.

Figure 8:
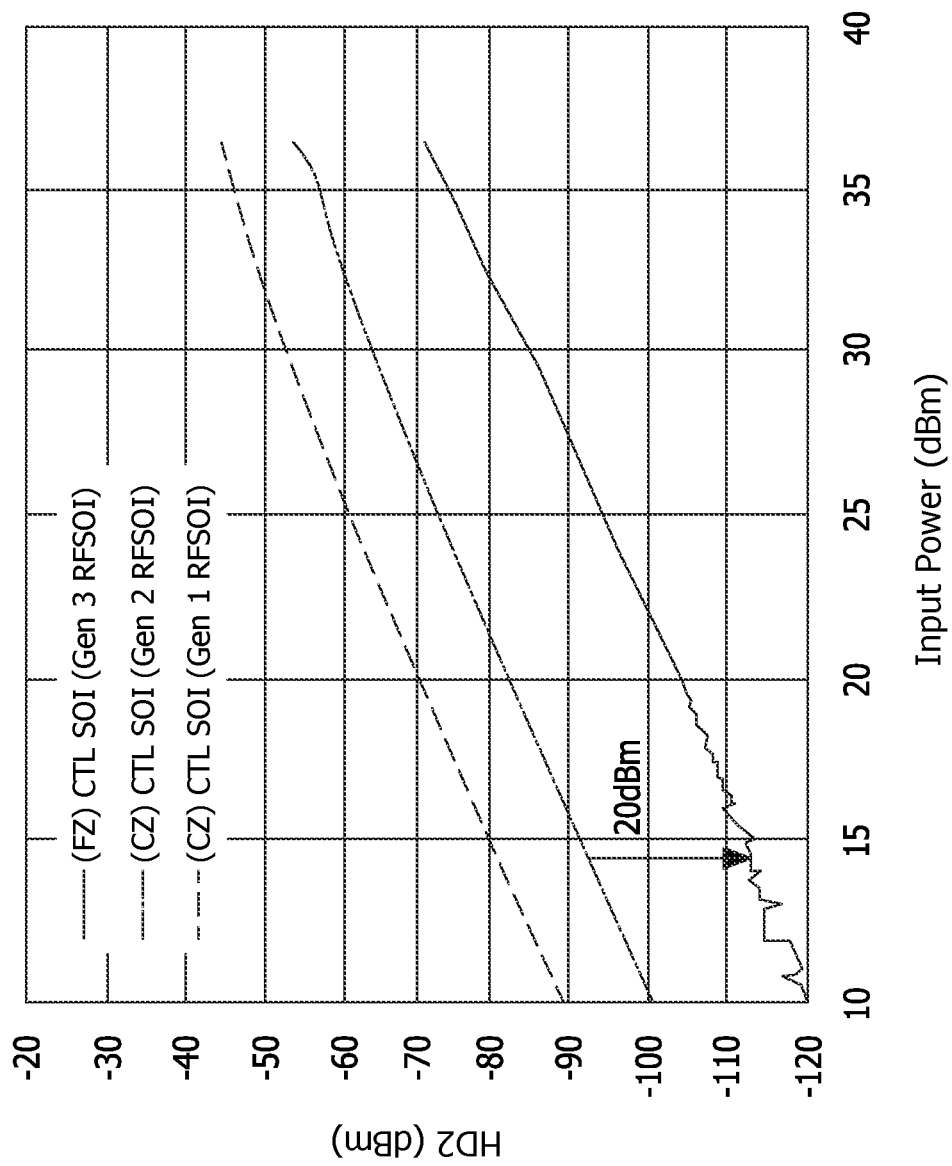
FIG. 8 is a graph depicting harmonic distortion (HD2) of SOI multilayer structures in which the handle substrates are made using the Float Zone method vs Pin compared to the harmonic distortion (HD2) of SOI multilayer structures in which the handle substrates are made using the Czochralski method vs Pin.

FIG. 8 shows the HD2 performance of our first and second generation SOI wafers having handle substrates prepared by the Czochralski method. The HD2 at Pin=15 dBm for these wafers are −80 dBm and −90 dBm, respectively. By contrast, the HD2 of the SOI structures having FZ handle substrates shows a dramatic improvement 20 dBm to a value of −110 dBm at Pin=15 dBm. The difference in performance is driven by the difference in resistivity between the typical CZ wafer and the FZ wafers. HD2 was measured on multiple sites on the wafers and no strong radial variation in HD2 was observed. The SOI structures having FZ handle substrates consistently had better performance than the SOI wafers having handle substrates prepared by the Czochralski method.

When introducing elements of the present disclosure or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the disclosure, it is intended that all matter contained in the above description and shown in the accompanying drawings shall be interpreted as illustrative and not in a limiting sense.

What is claimed is:

1. A method of preparing a multilayer structure, the method comprising:
   providing a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, and a central plane of the single crystal semiconductor handle substrate between the front and back surfaces of the single crystal semiconductor handle substrate, wherein the single crystal semiconductor handle substrate has a bulk resistivity of at least about 5000 ohm-cm, an interstitial oxygen concentration of less than about $1\times10^{16}$ atoms/cm$^3$, a nitrogen concentration of at least about $1\times10^{13}$ atoms/cm$^3$, and an excess thermal donor concentration of less than $1\times10^{11}$ donors/cm$^3$;

depositing a trap rich layer on the front surface of the single crystal semiconductor handle substrate;

bonding a front surface of a single crystal semiconductor donor substrate to the trap rich layer to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate; and annealing the bonded structure.

2. The method of claim 1, wherein the annealing the bonded structure is performed at a temperature between 200° C. and 400° C.

3. The method of claim 1, wherein the annealing the bonded structure is performed at a pressure between 0.5 MPa and 200 MPa and a temperature between 300° C. and 700° C.

4. The method of claim 1, further comprising:
forming a dielectric layer on the trap rich layer;
bonding the front surface of the single crystal semiconductor donor substrate to the dielectric layer to thereby form the bonded structure; and
annealing the bonded structure.

5. The method of claim 1, wherein the single crystal semiconductor donor substrate comprises a dielectric layer in interfacial contact with the front surface of the single crystal semiconductor donor substrate, the method further comprising:
bonding the dielectric layer of the single crystal semiconductor donor substrate to the trap rich layer to thereby form the bonded structure; and
annealing the bonded structure.

6. The method of claim 1, wherein the single crystal semiconductor donor substrate comprises a donor cleave plane, wherein the annealing the bonded structure is performed at a temperature and for a duration sufficient to thermally activate the donor cleave plane.

7. The method of claim 6, further comprising cleaving the bonded structure at the thermally activated donor cleave plane to thereby prepare a cleaved structure comprising the single crystal semiconductor handle substrate, the trap rich layer, and a single crystal semiconductor device layer.

8. The method of claim 7, further comprising annealing the cleaved structure.

9. The method of claim 8, wherein the annealing the cleaved structure is performed at a temperature between 1000° C. and 1200° C.

10. The method of claim 7, further comprising depositing an epitaxial layer on the single crystal semiconductor device layer of the cleaved structure.

11. The method of claim 10, wherein the epitaxial layer comprises a material selected from a group consisting of silicon, silicon carbide, silicon germanium, gallium arsenide, gallium nitride, indium phosphide, indium gallium arsenide, germanium, and combinations thereof.

12. The method of claim 10, wherein the epitaxial layer comprises at least one electrically active dopant selected from a group consisting of boron, gallium, aluminum, indium, phosphorus, antimony, and arsenic.

13. The method of claim 10, wherein the epitaxial layer has a resistivity of from 1 to 1050 Ohm-cm.

14. The method of claim 1 wherein the single crystal semiconductor handle substrate has a bulk resistivity of at least about 10,000 ohm-cm.

15. The method of claim 1 wherein the single crystal semiconductor handle substrate has the excess thermal donor concentration of less than $5\times10^{10}$ donors/cm$^3$.

16. The method of claim 1 wherein the single crystal semiconductor handle substrate comprises a p-type dopant at a concentration of less than $1\times10^{12}$ atoms/cm$^3$ and further wherein a concentration of oxygen thermal double donors, new donors, and excess thermal donors, or any combination thereof is at least an order of magnitude less than the concentration of the p-type dopant.

17. The method of claim 1 wherein the single crystal semiconductor handle substrate comprises a p-type dopant at a concentration of less than $1\times10^{11}$ atoms/cm$^3$ and further wherein a concentration of oxygen thermal double donors, new donors, and excess thermal donors, or any combination thereof is at least an order of magnitude less than the concentration of the p-type dopant.

18. The method of claim 1 wherein the single crystal semiconductor handle substrate comprises an n-type dopant at a concentration of less than $1\times10^{12}$ atoms/cm$^3$ and further wherein a concentration of oxygen thermal double donors, new donors, and excess thermal donors, or any combination thereof is at least an order of magnitude less than the concentration of the n-type dopant.

19. The method of claim 1 wherein the single crystal semiconductor handle substrate comprises an n-type dopant at a concentration of less than $1\times10^{11}$ atoms/cm$^3$ and further wherein a concentration of oxygen thermal double donors, new donors, and excess thermal donors, or any combination thereof is at least an order of magnitude less than the concentration of the n-type dopant.

20. The method of claim 1 wherein the single crystal semiconductor handle substrate has the interstitial oxygen concentration of less than about $1\times10^{15}$ atoms/cm$^3$.

21. The method of claim 1 wherein the single crystal semiconductor handle substrate has the nitrogen concentration of at least about $1\times10^{14}$ atoms/cm$^3$.

22. The method of claim 1 wherein the single crystal semiconductor handle substrate has the nitrogen concentration of less than about $3\times10^{15}$ atoms/cm$^3$.

23. The method of claim 1 wherein the single crystal semiconductor handle substrate has the nitrogen concentration of less than about $1\times10^{15}$ atoms/cm$^3$.

24. The method of claim 1 wherein the single crystal semiconductor handle substrate has the nitrogen concentration of less than about $7\times10^{14}$ atoms/cm$^3$.

25. The method of claim 1 wherein the single crystal semiconductor handle substrate has the nitrogen concentration between about $5\times10^{14}$ atoms/cm$^3$ and about $2\times10^{15}$ atoms/cm$^3$.

26. The method of claim 1 wherein the trap rich layer comprises one or more polycrystalline semiconductor layers, wherein each of the one or more polycrystalline semiconductor layers comprises a material selected from a group consisting of silicon, SiGe, SiC, and Ge.

27. The method of claim 1 wherein the trap rich layer comprises one or more amorphous semiconductor layers, wherein each of the one or more amorphous semiconductor layers comprises a material selected from a group consisting of silicon, SiGe, SiC, and Ge.

28. The method of claim 1 wherein the trap rich layer has a resistivity greater than about 1000 Ohm-cm.

29. The method of claim 1 wherein the trap rich layer has a resistivity between about 3000 Ohm-cm and about 10,000 Ohm-cm.

30. The method of claim 1 wherein the trap rich layer has a thickness between about 0.1 micrometer and about 50 micrometers.

31. The method of claim 1 wherein depositing the trap rich layer comprises depositing the trap rich layer using metalorganic chemical vapor deposition, physical vapor deposition, chemical vapor deposition, low pressure chemical vapor deposition, plasma enhanced chemical vapor deposition, or molecular beam epitaxy.

* * * * *